United States Patent
Takahashi

(10) Patent No.: US 10,775,526 B2
(45) Date of Patent: Sep. 15, 2020

(54) CAPACITANCE DETECTING DEVICE

(71) Applicant: AISIN SEIKI KABUSHIKI KAISHA, Kariya (JP)

(72) Inventor: Akira Takahashi, Tokorozawa (JP)

(73) Assignee: AISIN SAIKI KABUSHIKI KAISHA, Kariya-shi (JP)

( * ) Notice: Subject to any disclaimer, the term of this patent is extended or adjusted under 35 U.S.C. 154(b) by 136 days.

(21) Appl. No.: 16/202,603

(22) Filed: Nov. 28, 2018

(65) Prior Publication Data

US 2019/0162869 A1    May 30, 2019

(30) Foreign Application Priority Data

Nov. 28, 2017 (JP) ................. 2017-228082

(51) Int. Cl.
*G01V 3/08* (2006.01)
*H03K 5/1252* (2006.01)
*G11C 27/02* (2006.01)
*H03K 17/955* (2006.01)
*G01R 27/26* (2006.01)

(52) U.S. Cl.
CPC ............ *G01V 3/088* (2013.01); *G11C 27/02* (2013.01); *H03K 5/1252* (2013.01); *H03K 17/955* (2013.01); *G01R 27/2605* (2013.01); *H03K 2217/960715* (2013.01)

(58) Field of Classification Search
CPC ... G01V 3/088; H03K 5/1252; G01R 27/2605
See application file for complete search history.

(56) References Cited

U.S. PATENT DOCUMENTS

| | | | |
|---|---|---|---|
| 6,278,283 B1* | 8/2001 | Tsugai | G01R 27/2605 324/678 |
| 6,466,036 B1 | 10/2002 | Philipp | |
| 7,015,705 B2* | 3/2006 | Inaba | G01R 27/2605 324/658 |
| 8,217,666 B2* | 7/2012 | Hagimoto | G01D 5/24 324/658 |

(Continued)

FOREIGN PATENT DOCUMENTS

| | | |
|---|---|---|
| JP | 2005-106665 | 4/2005 |
| JP | 2011-194641 | 10/2011 |

*Primary Examiner* — Dominic E Hawkins
(74) *Attorney, Agent, or Firm* — Oblon, McClelland, Maier & Neustadt, L.L.P.

(57) ABSTRACT

A capacitance detecting device includes: first and second capacitors connected in series to each other between a power source and a detection electrode; first, second and third switches connected between terminals of the first capacitor, between the first and second capacitors, and between terminals of the second capacitor, respectively; a control circuit controlling to turn on/off the first, second and third switches, connected to a connection node between the first capacitor and the second switch, and detecting a change in a capacitance of the second capacitor; a filter circuit connected to the connection node, transmitting a potential of a frequency including switching frequencies of the second and third switches, and not transmitting a potential of another specific frequency; and a sample-and-hold circuit connected between the filter circuit and the control circuit.

3 Claims, 1 Drawing Sheet

(56) References Cited

U.S. PATENT DOCUMENTS

| | | | |
|---|---|---|---|
| 2005/0099068 A1* | 5/2005 | Kimura | H03K 19/01728 307/112 |
| 2012/0056630 A1* | 3/2012 | Itou | G01P 15/125 324/679 |

* cited by examiner

CAPACITANCE DETECTING DEVICE

CROSS REFERENCE TO RELATED APPLICATIONS

This application is based on and claims priority under 35 U.S.C. § 119 to Japanese Patent Application 2017-228082, filed on Nov. 28, 2017, the entire contents of which are incorporated herein by reference.

TECHNICAL FIELD

This disclosure relates to a capacitance detecting device.

BACKGROUND DISCUSSION

A capacitance detecting device disclosed in JP 2005-106665A (Reference 1) includes a first capacitor and a second capacitor connected in series to each other between a first power source and a second power source. A first switch is connected between terminals of the first capacitor. A second switch is connected between the first capacitor and the second capacitor. A third switch is connected between terminals of the second capacitor.

In this capacitance detecting device, firstly, only the first switch is controlled to turn on. Accordingly, the first capacitor is discharged so that the potentials of the terminals of the first capacitor become equal to the potential of the first power source together. Thereafter, only the second switch is controlled to turn on. Accordingly, the potential of the terminal of the first switch on the second capacitor side is lowered, and the second capacitor is charged. Thereafter, only the third switch is controlled to turn on. Accordingly, the second capacitor is discharged. As the control of switching on the second switch and the control of switching on the third switch are alternately repeated, the potential of the terminal of the first capacitor on the second capacitor side is gradually reduced. A change in the capacitance of the second capacitor is detected based on the number of times by which the second switch is controlled to turn on until this potential is less than a reference potential.

Electromagnetic noise is mixed in a circuit of a capacitance detecting device disclosed in Reference 1. When a potential of a terminal of a first capacitor on a second capacitor side changes due to the electromagnetic noise, it may be erroneously determined due to the change that the potential reaches a reference potential or does not reach the reference potential. When such erroneous determination is made, detection accuracy of the change in the capacitance of the second capacitor deteriorates.

SUMMARY

A capacitance detecting device according to an aspect of this disclosure includes a first capacitor and a second capacitor that are connected in series to each other between a power source and a detection electrode, a first switch that is connected between terminals of the first capacitor, a second switch that is connected between the first capacitor and the second capacitor, a third switch that is connected between terminals of the second capacitor, a control circuit that controls to turn on/off the first switch, the second switch, and the third switch, is connected to a connection node between the first capacitor and the second switch, and detects a change in a capacitance of the second capacitor based on a potential of the connection node, a filter circuit that is connected to the connection node, transmits a potential of a frequency including switching frequencies of the second switch and the third switch, and does not transmit a potential of another specific frequency, and a sample-and-hold circuit that is connected between the filter circuit and the control circuit. The sample-and-hold circuit outputs a potential according to output of the filter circuit in a case where the second switch is controlled to turn on, and holds and outputs a potential according to the output of the filter circuit obtained when the second switch is controlled to turn off, until the second switch is controlled to turn on at a next time, in a case where the second switch is controlled to turn off.

BRIEF DESCRIPTION OF THE DRAWINGS

The foregoing and additional features and characteristics of this disclosure will become more apparent from the following detailed description considered with the reference to the accompanying drawings, wherein.

DETAILED DESCRIPTION

Hereinafter, an embodiment of the capacitance detecting device will be described with reference to the accompanying drawings. The capacitance detecting device is, for example, a device that is embedded in a door handle of a vehicle and detects whether a user touches the door handle.

Figure 1:
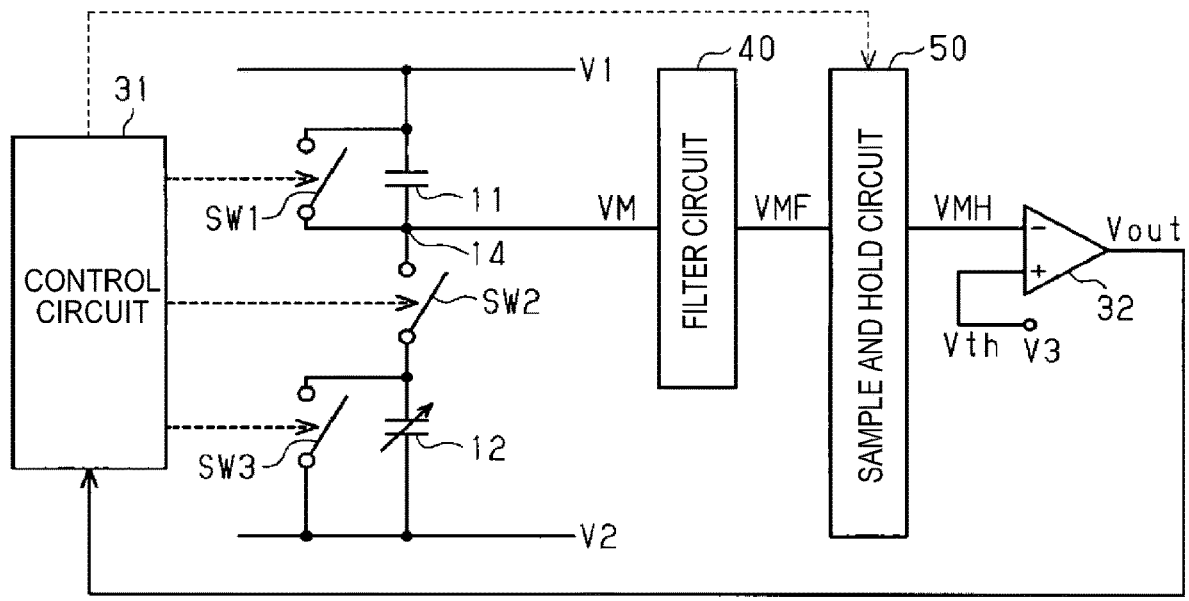
FIG. 1 is a circuit diagram of a capacitance detecting device.

As illustrated in FIG. 1, the capacitance detecting device includes a first power source V1 using a direct current. One terminal of a first capacitor 11 is connected to the first power source V1. The first capacitor 11 has a constant capacitance. A second capacitor 12 is connected in series to the first capacitor 11. The capacitance of the second capacitor 12 is smaller than the capacitance of the first capacitor 11. A second power source V2 is connected to a terminal of the second capacitor 12, which is opposite to a side connected to the first capacitor 11. In the present embodiment, the second power source V2 is a plate-shaped detection electrode disposed in a free space. Thus, the potential of the second power source V2 is approximately a ground level. Further, when a conductor (for example, a finger of a human) approaches the detection electrode, the capacitance of the second capacitor 12 is changed. That is, the second capacitor 12 functions as a variable capacitor.

A first switch SW1 is connected between the terminal of the first capacitor 11 on the first power source V1 side and a terminal of the first capacitor 11 on the second capacitor 12 side. A second switch SW2 is connected between the terminal of the first capacitor 11 on the second capacitor 12 side and a terminal of the second capacitor 12 on the first capacitor 11 side. A third switch SW3 is connected between the terminal of the second capacitor 12 on the first capacitor 11 side and the terminal of the second capacitor 12 on the second power source V2 side. The first switch SW1, the second switch SW2, and the third switch SW3 are, for example, MOS transistors, and ON/OFF states of the first switch SW1, the second switch SW2, and the third switch SW3 are controlled depending on a control signal from a control circuit 31.

An input terminal of a filter circuit 40 is connected to a connection node 14 (hereinafter, simply and briefly referred to as the connection node 14) between the first capacitor 11 and the second switch SW2. The filter circuit 40, which is a so-called low pass filter, transmits a potential of a frequency that is equal to or less than a predetermined frequency (for example, 20 MHz), and does not transmit a potential of a frequency that is more than the predetermined frequency. Switching frequencies of the second switch SW2 and the third switch SW3 are equal to or less than the predetermined frequency. An input terminal of a sample-and-hold circuit 50 is connected to an output terminal of the filter circuit 40.

The sample-and-hold circuit 50 operates according to an ON/OFF control of the second switch SW2. In detail, when the second switch SW2 is controlled to turn on, the sample-and-hold circuit 50 outputs a post-filter potential VMF, which is an output potential of the filter circuit 40, as a hold potential VMH without changing the post-filter potential VMF as it is. Further, when the second switch SW2 is controlled to turn off, the sample-and-hold circuit 50 holds the post-filter potential VMF obtained when the second switch SW2 is controlled to turn off, and outputs the post-filter potential VMF as the hold potential VMH until the second switch SW2 is controlled to turn on at a next time. In the present embodiment, the sample-and-hold circuit 50 holds the post-filter potential VMF and outputs the post-filter potential VMF as the hold potential VMH, at a delay timing delayed by a predetermined time from a timing when the second switch SW2 is controlled to turn off. The predetermined time is set to a time which is sufficiently shorter than a switching period of the second switch SW2 and the third switch SW3, and which ranges, for example, from several nanoseconds to several tens of nanoseconds.

A non-inverting input terminal of a comparator 32 is connected to an output terminal of the sample-and-hold circuit 50. A third power source V3 is connected to an inverting input terminal of the comparator 32. The third power source V3 is a constant potential power source, and a reference potential Vth, which is the potential of the third power source V3, is lower than the potential of the first power source V1 and is higher than the potential of the second power source V2. When the hold potential VMH input to the non-inverting input terminal is equal to or more than the reference potential Vth input to an inverting input terminal, the comparator 32 outputs a low-level output signal Vout. Thus, when the hold potential VMH input to the non-inverting input terminal is less than the reference potential Vth input to the inverting input terminal, the comparator 32 outputs a high-level output signal Vout. An output terminal of the comparator 32 is connected to the control circuit 31.

The control circuit 31 controls to turn on/off the first switch SW1, the second switch SW2, and the third switch SW3, to detect a change in the capacitance of the second capacitor 12. Further, the control circuit 31 controls the sample-and-hold circuit 50 to perform switching between a state in which the sample-and-hold circuit 50 outputs the input potential as it is and a state in which the sample-and-hold circuit 50 holds and outputs the input potential at a predetermined timing.

The control circuit 31 detects the change in the capacitance of the second capacitor 12, based on the output signal Vout of the comparator 32. Flow at that time will be described below.

Figure 2:
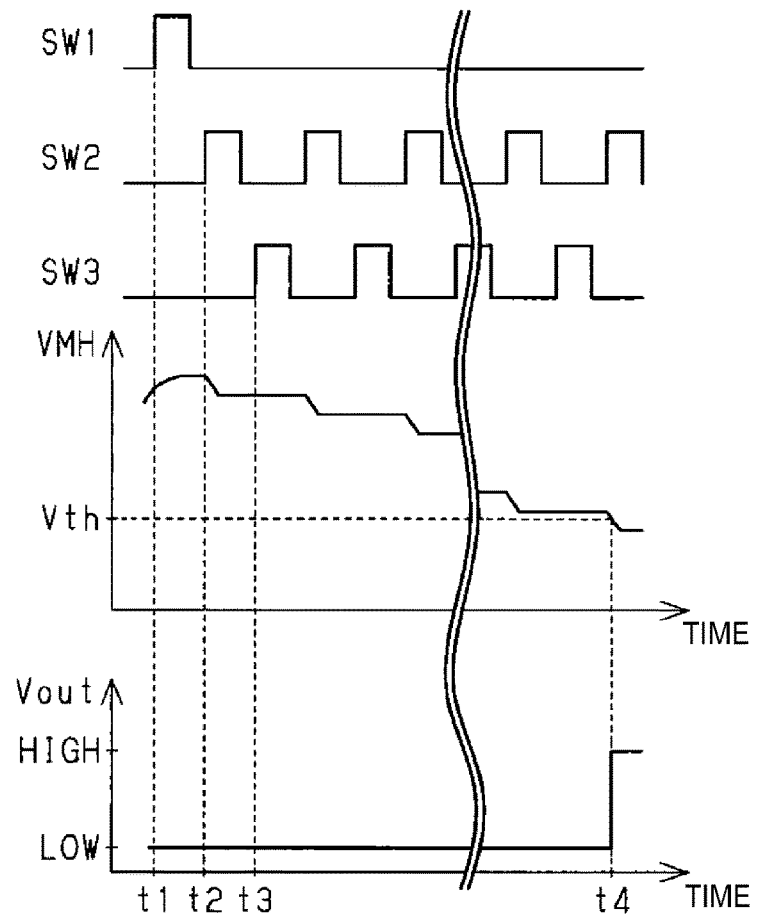
FIG. 2 is a timing chart of each signal in the capacitance detecting device.

As illustrated in FIG. 2, at a timing t1, the control circuit 31 starts a process of detecting the change in the capacitance of the second capacitor 12, firstly controls to turn on only the first switch SW1, and controls to turn off the second switch SW2 and the third switch SW3. Accordingly, the first capacitor 11 is discharged so that the potential VM of the connection node 14 becomes an initial potential which is the potential of the first power source V1. The initial potential is output to the sample-and-hold circuit 50 as the post-filter potential VMF through the filter circuit 40. The sample-and-hold circuit 50 outputs the post-filter VMF as the hold potential VMH as it is to the comparator 32 without changing the post-filter potential VMF. The comparator 32 compares the hold potential VMH with the reference potential Vth, and outputs the low-level output signal Vout to the control circuit 31, based on a result of the comparison.

Thereafter, at a timing t2, the control circuit 31 controls to turn on only the second switch SW2, and controls to turn off the first switch SW1 and the third switch SW3. Accordingly, the potential VM of the connection node 14 is lowered, and the second capacitor 12 is charged. While the second switch SW2 is controlled to turn on, the filter circuit 40 outputs, to the sample-and-hold circuit 50, the post-filter potential VMF obtained by filtering the potential VM of the connection node 14. The sample-and-hold circuit 50 outputs the post-filter potential VMF as the hold potential VMH as it is to the comparator 32 without changing the post-filter potential VMF. The comparator 32 compares the hold potential VMH with the reference potential Vth, and outputs the low-level output signal Vout to the control circuit 31, based on a result of the comparison.

Thereafter, at a timing t3, the control circuit 31 controls to turn on only the third switch SW3, and controls to turn off the first switch SW1 and the second switch SW2. Accordingly, the second capacitor 12 is discharged. While the second switch SW2 is controlled to turn off, the filter circuit 40 outputs, to the sample-and-hold circuit 50, the post-filter potential VMF obtained by filtering the potential VM of the connection node 14. The sample-and-hold circuit 50 holds the post-filter potential VMF obtained when the second switch SW2 is controlled to turn off, and outputs, to the comparator 32, the post-filter potential VMF as the hold potential VMH until the second switch SW2 is controlled to turn on at a next time. The comparator 32 compares the hold potential VMH with the reference potential Vth, and outputs the low-level output signal Vout to the control circuit 31, based on a result of the comparison.

Thereafter, the control circuit 31 alternately repeats the control of switching on only the second switch SW2 and the control of switching off only the third switch SW3. Accordingly, the potential VM of the connection node 14 gradually decreases. Accordingly, the hold potential VMH output to the comparator 32 by the sample-and-hold circuit 50 also decreases gradually. The hold potential VMH becomes lower than the reference potential Vth soon. At a timing t4 when the hold potential VMH is lower than the reference potential Vth, the output signal Vout of the comparator 32 becomes a high level.

Here, the control circuit 31 acquires the output signal Vout of the comparator 32 whenever the the second switch SW2 is controlled to turn off. In detail, the control circuit 31 acquires the output signal Vout at a latter half side timing that is later than a central timing while the second switch SW2 is controlled to turn off.

The control circuit 31 calculates how many times the control of switching on/off the second switch SW2 is repeated since the detection of the change in the capacitance of the second capacitor 12 starts until the high-level output signal Vout is acquired. The control circuit 31 compares a result of the calculation with a predetermined reference number of times, and detects that the capacitance of the second capacitor 12 changes, when a difference therebetween is equal to or more than a specified number of times. The reference number of times is experimentally obtained as the number of times by which the control of switching on/off the second switch SW2 is repeated until the high-level output signal Vout is acquired in a situation in which the conductor does not approach the detection electrode.

Next, an operation of the filter circuit 40 and the sample-and-hold circuit 50 when the control circuit 31 detects the change in the capacitance of the second capacitor 12 will be described.

Electromagnetic noise is mixed in a circuit of the capacitance detecting device. The electromagnetic noise is, for example, electromagnetic noise picked up by the second capacitor 12 and the second power source V2 (the detection electrode). In detail, since each terminal of the second capacitor 12 and the second power source V2 are conductors, the terminals of the second capacitor 12 and the second power source V2 function as antennas, and pick up the electromagnetic noise. Thus, when such electromagnetic noise is picked up, a terminal voltage of the second capacitor 12 changes. Therefore, in the case where the second switch SW2 is controlled to turn on, this electromagnetic noise changes the potential VM of the connection node 14.

Further, the other electromagnetic noise is, for example, electromagnetic noise occurring when the first power source V1 generates a voltage and electromagnetic noise mixed in a wiring from the first power source V1 to the first capacitor 11. When the electromagnetic noise is picked up, a terminal voltage of the first capacitor 11 varies. Therefore, in the case where the second switch SW2 is controlled to turn off, this electromagnetic noise changes the potential VM of the connection node 14.

When the above-described electromagnetic noise is included in the potential VM of the connection node 14, if the comparator 32 compares the potential VM itself with the reference potential Vth, the following problem may occur. That is, the potential VM of the connection node 14 changes due to the electromagnetic noise. Due to the change, it can be erroneously determined that the potential VM of the connection node 14 reaches the reference potential Vth. Otherwise, it can be erroneously determined that the potential VM does not reach the reference potential Vth.

In this regard, in the above-described configuration, the filter circuit 40 and the sample-and-hold circuit 50 are provided between the connection node 14 and the comparator 32. As described above, in the case where the second switch SW2 is controlled to turn on, the potential VM of the connection node 14 includes electromagnetic noise from the second capacitor 12 side. The filter circuit 40 can filter a change in a potential of a frequency, which corresponds to this electromagnetic noise, and can block at least a part of the electromagnetic noise. Thus, the hold potential VMH output to the comparator 32 by the sample-and-hold circuit 50 is a potential after this filtering. Thus, a potential of which a change caused by the electromagnetic noise is suppressed is input to the comparator 32.

Further, the potential VM of the connection node 14 includes electromagnetic noise from the first power source V1. In the case where the second switch SW2 is controlled to turn off, the sample-and-hold circuit 50 continuously holds the post-filter potential VMF obtained in the case where the second switch SW2 is controlled to turn off. In this way, when a constant potential is maintained, influence of the electromagnetic noise is not reflected on the hold potential VMH output to the comparator 32 by the sample-and-hold circuit 50. That is, a potential not including a change caused by the electromagnetic noise is input to the comparator 32.

According to the present embodiment, the following effects can be obtained.

(1) Influence of the electromagnetic noise from the potential VM of the connection node 14, which is used when the control circuit 31 detects the change in the capacitance of the second capacitor 12, can be removed by the filter circuit 40 and the sample-and-hold circuit 50. As a result, detection accuracy of the change in the capacitance of the second capacitor 12 is improved.

(2) A small lag may occur due to switching noise of the second switch SW2 until the potential VM of the connection node 14 is completely stabilized after the second switch SW2 is controlled to turn off. In this regard, in the above-described configuration, the sample-and-hold circuit 50 holds the post-filter potential VMF at a delay timing delayed by a predetermined time from a timing when the second switch SW2 is controlled to turn off. Therefore, the output of the post-filter potential VMF as the hold potential VMH, corresponding to the potential VM of the connection node 14 in an unstable state, to the comparator 32 is suppressed. Thus, the comparison of the hold potential VMH in an unstable state with the reference potential Vth by the comparator 32 is suppressed. As a result, improvement of reliability of a result of the comparison by the comparator 32 is expected.

(3) Immediately after the potential input to the comparator 32 is changed, a time during which an input potential is reflected in an internal circuit of the comparator 32 is required, and the potential becomes unstable. Therefore, immediately after the potential input to the comparator 32 is changed, reliability of output of the result of the comparison by the comparator 32 deteriorates. In the above-described configuration, the change in the capacitance of the second capacitor 12 is detected based on the output signal Vout of the comparator 32 during a period during which it is considered that the reliability of the result of the comparison is high, which is referred to as a latter half side of a period during which the second switch SW2 is controlled to turn off. Therefore, when the change in the capacitance of the second capacitor 12 is detected based on the result of the comparison by the comparator 32, improvement of the detection accuracy is expected.

The above-described embodiment can be modified and realized as follows.

The control circuit 31 may acquire the output signal Vout from the comparator 32 at a former half side timing that is earlier than a central timing while the second switch SW2 is controlled to turn off. At the former half side timing, at a timing delayed to some extent from the timing when the second switch SW2 is switched off, it is considered that the potential input to the comparator 32 is relatively stable. Therefore, in such a timing, a possibility that the output of the result of the comparison by the comparator 32 deteriorates is reduced. Even when the potential input to the comparator 32 is changed by performance, functions, and the like of the comparator 32, when the potential is stable immediately after the change in the potential, the control circuit 31 may acquire the output signal Vout in any period regardless of whether the second switch SW2 is switched on/off.

The comparator 32 may be disused, and the hold potential VMH output from the sample-and-hold circuit 50 may be input to the control circuit 31. Thus, the reference potential Vth is stored in the control circuit 31 in advance, and the control circuit 31 may compare the hold potential VMH with the reference potential Vth.

The potential held in the sample-and-hold circuit 50 during the period during which the second switch SW2 is controlled to turn off may be set as the post-filter potential VMF at a time point (a timing before the delay timing) at which the second switch SW2 is controlled to turn off. For example, when a degree to which the potential VM of the connection node 14 becomes unstable after the second switch SW2 is controlled to turn off is very small, even when the post-filter potential VMF at a time point when the second switch SW2 is controlled to turn off is held by the sample-and-hold circuit 50, the reliability of the result of the comparison by the comparator 32 hardly deteriorates.

The filter circuit 40 may be connected between the terminal of the second capacitor 12 on the first capacitor 11 side and the second switch SW2 or between the second switch SW2 and the connection node 14. In this case, the sample-and-hold circuit 50 needs to be connected between the connection node 14 and the comparator 32.

The filter circuit 40 may not be a low pass filter. For example, the filter circuit 40 may be a band pass filter that does not allow a potential of a frequency in a specific range to pass therethrough. However, the filter circuit 40 needs to transmit a potential of a frequency including switching frequencies of the second switch SW2 and the third switch SW3.

A method of detecting the change in the capacitance of the second capacitor 12 may be based on the potential VM of the connection node 14. For example, in the above-described embodiment, a period from a time when the detection of the change in the capacitance of the second capacitor 12 starts to a time when the high-level output signal Vout is acquired is set as one cycle, and the cycle is repeated. Thus, a time series of the number of times, by which the control of switching on/off the second switch SW2 is repeated and which is calculated at each cycle, is created. When a time change of this time series exceeds an allowable range of a detection error, the change in the capacitance of the second capacitor 12 may be detected.

The second power source V2 may be grounded.

An installation place of the capacitance detecting device is not limited to a door handle of a vehicle. The capacitance detecting device may, for example, be installed inside a door of the vehicle or an emblem of the vehicle. The capacitance detecting device may be installed in a place other than the vehicle.

A capacitance detecting device according to an aspect of this disclosure includes a first capacitor and a second capacitor that are connected in series to each other between a power source and a detection electrode, a first switch that is connected between terminals of the first capacitor, a second switch that is connected between the first capacitor and the second capacitor, a third switch that is connected between terminals of the second capacitor, a control circuit that controls to turn on/off the first switch, the second switch, and the third switch, is connected to a connection node between the first capacitor and the second switch, and detects a change in a capacitance of the second capacitor based on a potential of the connection node, a filter circuit that is connected between a terminal of the second capacitor on the second switch side and the control circuit, transmits a potential of a frequency including switching frequencies of the second switch and the third switch, and does not transmit a potential of another specific frequency, and a sample-and-hold circuit that is connected between the filter circuit and the control circuit and between the connection node and the control circuit. The sample-and-hold circuit outputs a potential according to output of the filter circuit in a case where the second switch is controlled to turn on, and holds and outputs a potential according to the output of the filter circuit obtained when the second switch is controlled to turn off, until the second switch is controlled to turn on at a next time, in a case where the second switch is controlled to turn off.

In the above-described configuration, the filter circuit can filter a change in a potential of a specific frequency. Thus, the potential output by the sample-and-hold circuit is a potential after this filtering. Therefore, a signal of which a change caused by the electromagnetic noise is suppressed is input to the control circuit. Further, in the above-described configuration, in the case where the second switch is controlled to turn off, the sample-and-hold circuit continuously holds a constant potential. In this way, when a constant potential is continuously maintained, influence of the electromagnetic noise is not reflected on the potential held by the sample-and-hold circuit. Therefore, influence of the electromagnetic noise from the potential of the connection node, which is used when the control circuit detects the change in the capacitance of the second capacitor, can be removed. As a result, detection accuracy of the change in the capacitance of the second capacitor is improved.

In the capacitance detecting device, in the case where the second switch is controlled to turn off, the sample-and-hold circuit may hold and output the potential according to the output of the filter circuit as the potential obtained when the second switch is controlled to turn off at a delay timing delayed by a predetermined time from a timing when the second switch is controlled to turn off.

A small lag may occur until the potential VM of the connection node is completely stabilized after the second switch is controlled to turn off. In this regard, in the above-described configuration, the sample-and-hold circuit holds the potential of the connection node at a delay timing delayed by the predetermined time from the timing when the second switch is controlled to turn off. Therefore, a state in which the sample-and-hold circuit holds and outputs the potential of the connection node in an unstable state can be suppressed.

In the capacitance detecting device, a comparator that compares a potential output by the sample-and-hold circuit with a predetermined reference potential, and outputs an output signal to the control circuit based on a result of the comparison may be provided between the sample-and-hold circuit and the control circuit. Thus, the control circuit may detect the change in the capacitance of the second capacitor based on the output signal of the comparator at a latter half side timing that is later than a central timing while the second switch is controlled to turn off.

Immediately after the potential input to the comparator is changed, a time during which an input potential is reflected in an internal circuit of the comparator is required, and the potential becomes unstable. Therefore, immediately after the potential input to the comparator is changed, reliability of output of the result of the comparison by the comparator deteriorates. According to the above-described configuration, the change in the capacitance of the second capacitor is detected based on the output signal of the comparator during a period during which it is considered that the reliability of the result of the comparison is high, which is referred to as a latter half side of a period during which the second switch is controlled to turn off. Therefore, when the change in the capacitance of the second capacitor is detected based on the result of the comparison by the comparator, improvement of the detection accuracy is expected.

According to the aspect of this disclosure, the detection accuracy of the change in the capacitance of the capacitor is improved.

The principles, preferred embodiment and mode of operation of the present invention have been described in the foregoing specification. However, the invention which is intended to be protected is not to be construed as limited to the particular embodiments disclosed. Further, the embodiments described herein are to be regarded as illustrative rather than restrictive. Variations and changes may be made by others, and equivalents employed, without departing from the spirit of the present invention. Accordingly, it is expressly intended that all such variations, changes and equivalents which fall within the spirit and scope of the present invention as defined in the claims, be embraced thereby.

What is claimed is:

1. A capacitance detecting device comprising:
   a first capacitor and a second capacitor that are connected in series to each other between a power source and a detection electrode;
   a first switch that is connected between terminals of the first capacitor;
   a second switch that is connected between the first capacitor and the second capacitor;
   a third switch that is connected between terminals of the second capacitor;
   a control circuit that controls to turn on/off the first switch, the second switch, and the third switch, is connected to a connection node between the first capacitor and the second switch, and detects a change in a capacitance of the second capacitor based on a potential of the connection node;
   a filter circuit that is connected to the connection node, transmits a potential of a frequency including switching frequencies of the second switch and the third switch, and does not transmit a potential of another specific frequency; and
   a sample-and-hold circuit that is connected between the filter circuit and the control circuit,
   wherein the sample-and-hold circuit outputs a potential according to output of the filter circuit in a case where the second switch is controlled to turn on, and holds and outputs a potential according to the output of the filter circuit obtained when the second switch is controlled to turn off, until the second switch is controlled to turn on at a next time, in a case where the second switch is controlled to turn off.

2. The capacitance detecting device according to claim 1, wherein in the case where the second switch is controlled to turn off, the sample-and-hold circuit holds and outputs the potential according to the output of the filter circuit as a potential obtained when the second switch is controlled to turn off at a delay timing delayed by a predetermined time from a timing when the second switch is controlled to turn off.

3. The capacitance detecting device according to claim 1, wherein a comparator that compares a potential output by the sample-and-hold circuit with a predetermined reference potential and outputs an output signal to the control circuit based on a result of the comparison is provided between the sample-and-hold circuit and the control circuit, and
   the control circuit detects a change in a capacitance of the second capacitor based on the output signal of the comparator at a latter half side timing that is later than a central timing while the second switch is controlled to turn off.

* * * * *